US009715990B2

(12) United States Patent
Alexy et al.

(10) Patent No.: US 9,715,990 B2
(45) Date of Patent: Jul. 25, 2017

(54) ELECTRON BEAM WINDOW TILE HAVING NON-UNIFORM CROSS-SECTIONS

(71) Applicant: Energy Sciences Inc., Wilmington, MA (US)

(72) Inventors: Rich Alexy, Auburndale, MA (US); Imtiaz Rangwalla, Andover, MA (US); Jonathan Baroud, Holliston, MA (US)

(73) Assignee: Energy Sciences Inc., Wilmington, MA (US)

( * ) Notice: Subject to any disclaimer, the term of this patent is extended or adjusted under 35 U.S.C. 154(b) by 0 days.

(21) Appl. No.: 14/974,928

(22) Filed: Dec. 18, 2015

(65) Prior Publication Data

US 2016/0181056 A1  Jun. 23, 2016

Related U.S. Application Data

(60) Provisional application No. 62/094,356, filed on Dec. 19, 2014.

(51) Int. Cl.
*H01J 35/18* (2006.01)
*H01J 33/04* (2006.01)
(Continued)

(52) U.S. Cl.
CPC ............ *H01J 37/147* (2013.01); *H01J 33/04* (2013.01); *H01J 37/09* (2013.01); *H01J 2237/18* (2013.01)

(58) Field of Classification Search
CPC .... H01J 5/18; H01J 35/18; H01J 35/06; H01J 33/02; H01J 33/04; H01J 37/244; H01J 37/305; G21K 1/00; G21K 1/02; G21K 1/10; H01L 31/028; H01L 21/31116; H01L 21/31144
(Continued)

(56) References Cited

U.S. PATENT DOCUMENTS 5,621,270 A   4/1997  Allen
5,898,261 A   4/1999  Barker
(Continued)

FOREIGN PATENT DOCUMENTS

JP   2006-105908   4/2006

OTHER PUBLICATIONS

International Preliminary Report on Patentability and Written Opinion dated Mar. 11, 2016, issued in Corresponding PCT Application No. PCT/US2015/066790.

*Primary Examiner* — David A Vanore
(74) *Attorney, Agent, or Firm* — DLA Piper LLP (US)

(57) ABSTRACT

Window tiles for electron beam systems are provided. The window tiles can comprise a first surface and a second surface, and one or more features extending from the first surface to the second surface. The one or more features can have a non-uniform or tapered cross-section between the first surface and the second surface. The first surface can be configured to be exposed to vacuum conditions and can be configured to receive electrons accelerated from an electron beam generator. The second surface can be configured to allow electrons to pass through to a foil. The window tiles can improve electron beam processing systems for example by increasing electron throughput, lowering power consumption, reducing heat absorption to the foil, improving and increasing foil life, and potentially allowing for use of smaller and cheaper machines in electron beam processing.

42 Claims, 4 Drawing Sheets (51) Int. Cl.
*H01J 37/147* (2006.01)
*H01J 37/09* (2006.01)

(58) Field of Classification Search
USPC ..... 378/161, 121, 136, 140, 141; 250/505.1, 250/310, 305, 492.3
See application file for complete search history.

(56) References Cited

U.S. PATENT DOCUMENTS

| | | | | |
|---|---|---|---|---|
| 6,002,202 | A * | 12/1999 | Meyer | H01J 33/04 313/420 |
| 6,803,570 | B1 * | 10/2004 | Bryson, III | H01J 33/04 250/305 |
| 6,870,174 | B2 * | 3/2005 | Yamaguchi | H01J 33/04 250/492.3 |
| 7,145,988 | B2 * | 12/2006 | Price | A61B 6/032 378/121 |
| 7,641,806 | B2 * | 1/2010 | Okumura | G03F 1/22 216/12 |
| 7,709,820 | B2 * | 5/2010 | Decker | G21K 1/00 250/310 |
| 7,803,211 | B2 * | 9/2010 | Forbes Jones | B22F 9/14 75/336 |
| 9,076,628 | B2 * | 7/2015 | Davis | H01J 35/18 |
| 9,159,518 | B2 * | 10/2015 | Soltau | G01T 1/2928 |
| 9,299,469 | B2 * | 3/2016 | Larson | G21K 1/00 |
| 9,305,735 | B2 * | 4/2016 | Liddiard | H01J 5/18 |
| 2007/0177715 | A1 * | 8/2007 | Harding | H01J 5/18 378/140 |
| 2013/0077761 | A1 * | 3/2013 | Sipila | G21K 1/02 378/161 |
| 2013/0089184 | A1 * | 4/2013 | Sipila | G21K 1/02 378/161 |
| 2015/0053640 | A1 * | 2/2015 | Kostamo | B82Y 30/00 216/24 |
| 2015/0357150 | A1 * | 12/2015 | Kostamo | H01J 5/18 378/161 |

* cited by examiner

ELECTRON BEAM WINDOW TILE HAVING NON-UNIFORM CROSS-SECTIONS

TECHNICAL FIELD

Embodiments of the disclosure relate generally to electron beam systems, and more particularly, window tile assemblies for electron beam processing systems.

BACKGROUND

A particle beam processing device is commonly used to expose a substrate or coating to highly accelerated particle beams, such as an electron beam (EB), to cause a chemical reaction on the substrate or coating.

An electron is a negatively charged particle found in all matter. Electrons revolve around the nucleus of an atom much like planets revolve around the sun. By sharing electrons, two or more atoms bind together to form molecules. In EB processing, energetic electrons are used to modify the molecular structure of a wide variety of products and materials. For example, electrons can be used to alter specially designed liquid coatings, inks and adhesives. During EB processing, electrons break bonds and form charged particles and free radicals. These radicals then combine to form large molecules. By this process, the liquid is transformed into a solid. This process is known as polymerization.

Liquid coatings treated with EB processing may include printing inks, varnishes, silicone release coatings, primer coatings, pressure sensitive adhesives, barrier layers and laminating adhesives. EB processing may also be used to alter and enhance the physical characteristics of solid materials such as paper, substrates and non-woven textile substrates, all specially designed to react to EB treatment.

A particle beam processing device generally includes three zones, i.e., a vacuum chamber zone where a particle beam is generated, a particle accelerator zone, and a processing zone. In the vacuum chamber, a tungsten filament is heated to about 2400K, which is the thermionic emission temperature of tungsten, to create a cloud of electrons. A positive voltage differential is then applied to the vacuum chamber to extract and simultaneously accelerate these electrons. Thereafter, the electrons pass through a thin foil and enter the processing zone. The thin foil functions as a barrier between the vacuum chamber and the processing zone. Accelerated electrons exit the vacuum chamber through the thin foil and enter the processing zone at atmospheric conditions.

A window tile assembly can be used to support the foil in electron beam processing systems. Current window tile assembly features have a consistent cross-sectional geometry throughout the depth of the tile or window in the direction perpendicular to the foil.

Accordingly, there is a need for window tile assemblies that utilizes a non-uniform cross-sectional geometry throughout the depth of the tile, which can increase electron throughput and improve efficiency in electron beam processing systems.

SUMMARY

The present disclosure relates to window tile assemblies for use in particle beam systems, for example in electron beam processing. In one embodiment, a window tile for an electron beam system is provided. The window tile can comprise a first surface and a second surface, and one or more features extending from the first surface to the second surface. The one or more features can have a non-uniform cross-section between the first surface and the second surface. The first surface can be exposed to vacuum conditions and can be configured to receive electrons accelerated from an electron beam generator. The second surface can be adjacent a foil through which the electrons pass.

DETAILED DESCRIPTION

The following detailed description is exemplary and explanatory and is intended to provide further explanation of the present disclosure described herein. Other advantages, and novel features will be readily apparent to those skilled in the art from the following detailed description of the present disclosure.

In some embodiments, a window tile assembly for use in particle beam processing systems is provided. A particle beam generating assembly can be kept in a vacuum environment of a vessel or chamber. In an electron beam processing device, a particle generating assembly is commonly referred to as an electron gun assembly. An evacuated chamber may be constructed of a tightly sealed vessel in which particles, such as electrons, are generated. A vacuum pump can be provided to create a vacuum environment in the order of approximately $10^{-6}$ Torr, or other vacuum conditions as needed. Inside the vacuum environment of the chamber, a cloud of electrons are generated around a filament when a high-voltage power supply sends electrical power to heat up the filament.

With sufficient heating, the filament glows white hot and generates a cloud of electrons. The electrons are then drawn from the filament to areas of higher voltage, because electrons are negatively charged particles and accelerated to extremely high speeds. The filament may be constructed of one or more wires commonly made of tungsten, where two or more wires may be configured to be spaced evenly across the length of foil support and emits electron beams across the width of a substrate.

A particle beam generating assembly may include an extractor grid, a terminal grid, and a repeller. A repeller plate repels electrons and sends the electrons toward the extractor grid. The repeller plate can operate at a different voltage, such as a slightly lower voltage, than the filament to collect and redirect electrons escaping from the filament away from the electron beam direction.

The extractor grid can operate at a slightly different voltage, such as a voltage higher than the filament, and can attract the electrons away from the filament and guide them toward a terminal grid. The extractor grid can control the quantity of electrons being drawn from the cloud, which determines the intensity of the electron beam. The terminal grid can operate generally at the same voltage as extractor grid and can act as the final gateway for the electrons before they accelerate to extremely high speeds for passage through a foil support assembly. The filament may operate at −110,000 Volts (i.e. 110 kV) and the foil support assembly may be grounded or set at 0 Volt. The repeller plate may be selected to operate at −110,010 Volts to repel any electrons towards the filament. The extractor grid and the terminal grid may be selected to operate in a range of −1107000 Volts to −109,700 Volts.

The electrons can then exit the vacuum chamber and can enter a foil support system through a thin foil (for example a titanium foil) to penetrate a coated material or substrate to cause a chemical reaction, such as polymerization, cross-linking, or sterilization. The speed of the electrons may be as high as or above 100,000 miles per second. The thin foil can be securely clamped to the outside of the foil support assembly to ensure a leak-proof vacuum seal inside the chamber. High speed electrons can pass through the foil support system, through the thin foil and into a substrate being treated. To prevent an undue energy loss, the foil can be made as thin as possible while at the same time providing sufficient mechanical strength to withstand the pressure differential between the vacuum state inside the particle generating assembly and processing assembly.

The foil support system can comprise a window tile assembly. The window tile assembly can utilize a non-uniform cross-sectional geometry throughout the depth of the window tile. The window tile assembly can comprise a window body through which electrons pass. The window tile assembly can have a reduced or enlarged cross-sectional area at the point where electrons first encounter the window body and in the direction electrons pass through the window body toward the thin foil and into the substrate being treated.

In some embodiments, the window tile can comprise a first surface (e.g., a top surface) and a second surface (e.g., a bottom surface). As generally referred to herein, the first and second surfaces are in the horizontal direction and perpendicular to the first and second surfaces are in the vertical direction. The first surface and the second surface can be generally parallel. The first surface can be exposed to vacuum conditions and configured to receive electrons accelerated from an electron beam generator. The second surface can be adjacent to the thin foil. One or more features can extend from the first surface to the second surface. The features can comprise, for example (without limitation), fins, ribs, holes, drilled holes, and other suitable support geometry configurations. The electrons generated from the electron beam generator can pass freely between the features of the window tile assembly, through the thin foil, and into the substrate being treated. The features can have a non-uniform cross-section between the first surface and the second surface. The non-uniform cross-section can comprise a top cross-section. The non-uniformity of the cross-section of the features can have a tapering effect between the first surface and second surface. The features can be evenly distributed throughout the window tile assembly. The foil can be about 5 to 12.5 microns thick and the window tile assembly can provide mechanical support to the foil to support a pressure differential of, for example, almost 1 atmosphere from the vacuum side to the atmospheric side and high temperatures.

In some embodiments, thicknesses of the features can be optimized to provide suitable heat transfer and mechanical support to the foil. A ratio of the feature thickness at the vacuum side to the thickness at the foil side can be optimized to provide higher efficiency of electron throughput. For example, tapering the feature thicknesses allows a reduction of surface area between the first surface and the second surface which can allow the foil to feature contact area (e.g., at the second surface) to remain at a maximum for heat transfer purposes while reducing the amount of energy that is absorbed in the features. The amount of tapering can be of any suitable range. In an embodiment, the tapering can be in the amount of about 50%, for example the thickness of a feature at the first surface can be reduced (tapered) to about 50% at the second surface.

In some embodiments, a diameter of the cross-section of one or more of the features is greater at the first surface than the second surface. In other embodiments, a diameter of the cross-section of one or more of the features is less at the first surface than the second surface. In other embodiments, a diameter of the cross-section of one or more of the features between the first surface and the second surface is greater than the cross-section at the first and the second surface.

In some embodiments, the one or more features comprise a side view cross-section that comprises at least one section that is not entirely perpendicular to the first and second surface. A width of the side view cross-section at one or more distances between the first surface and the second surface can be different from a width of the side view cross section at one or more other distances between the first surface and the second surface. For example, a width of the side view cross-section at a first distance between the first surface and the second surface can be larger or smaller than a width of the side view cross-section at a second distance between the first surface and the second surface. In another embodiment, the one or more features comprise a side view cross-section that is not entirely straight.

In some embodiments, the one or more features comprise one or more cross-sectional areas at one or more distances between the first surface and second surface and one or more other cross-sectional areas at one or more other distances between the first surface and the second surface. The one or more cross-sectional areas can be different from the one or more other cross-sectional areas. For example, a first cross-sectional area at a first distance between the first surface and the second surface is larger or smaller than a second cross-sectional area at a second distance between the first surface and the second surface.

In some embodiments, the one or more features have a side view cross-section that is not entirely perpendicular to at least one of the first surface and the second surface, wherein the one or more features have a first horizontal diameter at the first surface, a second horizontal diameter at the second surface, and at least a third horizontal diameter between the first surface and the second surface. In some embodiments, the second horizontal diameter is greater than the third horizontal diameter and the third horizontal diameter is greater than the first horizontal diameter. In other embodiments, the first horizontal diameter is greater than the third horizontal diameter and the third horizontal diameter is greater than the second horizontal diameter. In other embodiments, the first horizontal diameter is equal to the second horizontal diameter and the third horizontal diameter is greater than both the first horizontal diameter and the second horizontal diameter.

In some embodiments, the side view cross-section of the one or more features can be any suitable shape, for example (without limitation), generally triangular, generally trapezoidal, generally elliptical, generally hexagonal, generally conical flask shaped, and irregularly shaped.

The window tile assembly can be of any size and dimension suitable for use in particle beam processing systems. For example, a 54 inch window body is suitable for use with a 54 inch electron beam accelerator. The window tile assembly can be made of any material suitable for use in particle beam processing systems. For example, the window tile assembly can be made of copper. The window tile assembly comprising the features (e.g., fins, ribs, drilled holes, etc.) can be created by various machining methods for example (without limitation), drilling (e.g., using drilling Electrical Discharge Machining (EDM) machines), milling and/or casting. The features can be made of copper, aluminum, or other suitable media conductive to high rates of heat transfer. Tapering of cross-sections of the features can be created by angling one or more wires in EDM applications. Tapering in features comprising drilled holes can be created using a taper drill or countersink to create non-cylindrical or conical holes. In machining applications, tapering can be created using tapered end mills. In casting applications, tapering can be incorporated into the casting mold.

The window tile assemblies according to the present disclosure can improve electron beam processing, for example (without limitation), by functioning to cool the thin foil, to support the thin foil under vacuum conditions including under a load of one (1) atm minimum, and to provide a point to seal the vacuum chamber from an external atmosphere. Additional benefits provided by the window tile assemblies according to the present disclosure include higher electron throughput, lower power consumption, reduction of heat absorption to the window features and thus to the foil (for example at the locations on the foil contacting the one or more features), improving and increasing foil life, potential use of smaller and cheaper machines in electron beam processing.

These benefits (among others) are achieved using the window tile assemblies according to the present disclosure, for example, based on the non-uniformity or tapering of the cross-sections of the one or more features (e.g., fins, ribs, holes, drilled holes, and other suitable support geometry configurations) between the first surface (e.g., the surface nearest the vacuum chamber) and the second surface (e.g., the surface nearest the thin foil) of the window body. For example, electrons passing from the vacuum chamber through the window tile assembly will pass freely between the features with less hindrance in the areas where the features are tapered than if the features have uniform, not tapered cross-sections. Reducing the hindrance encountered by the electrons passing through the window tile increases the number of electrons passing through the window tile and thin foil, increasing electron throughput of the electron beam system. Window tile assemblies with uniform or not-tapered features are unable to achieve these benefits because there is no reduction of the hindrance encountered by the electrons passing through the window tile.

Figure 1:
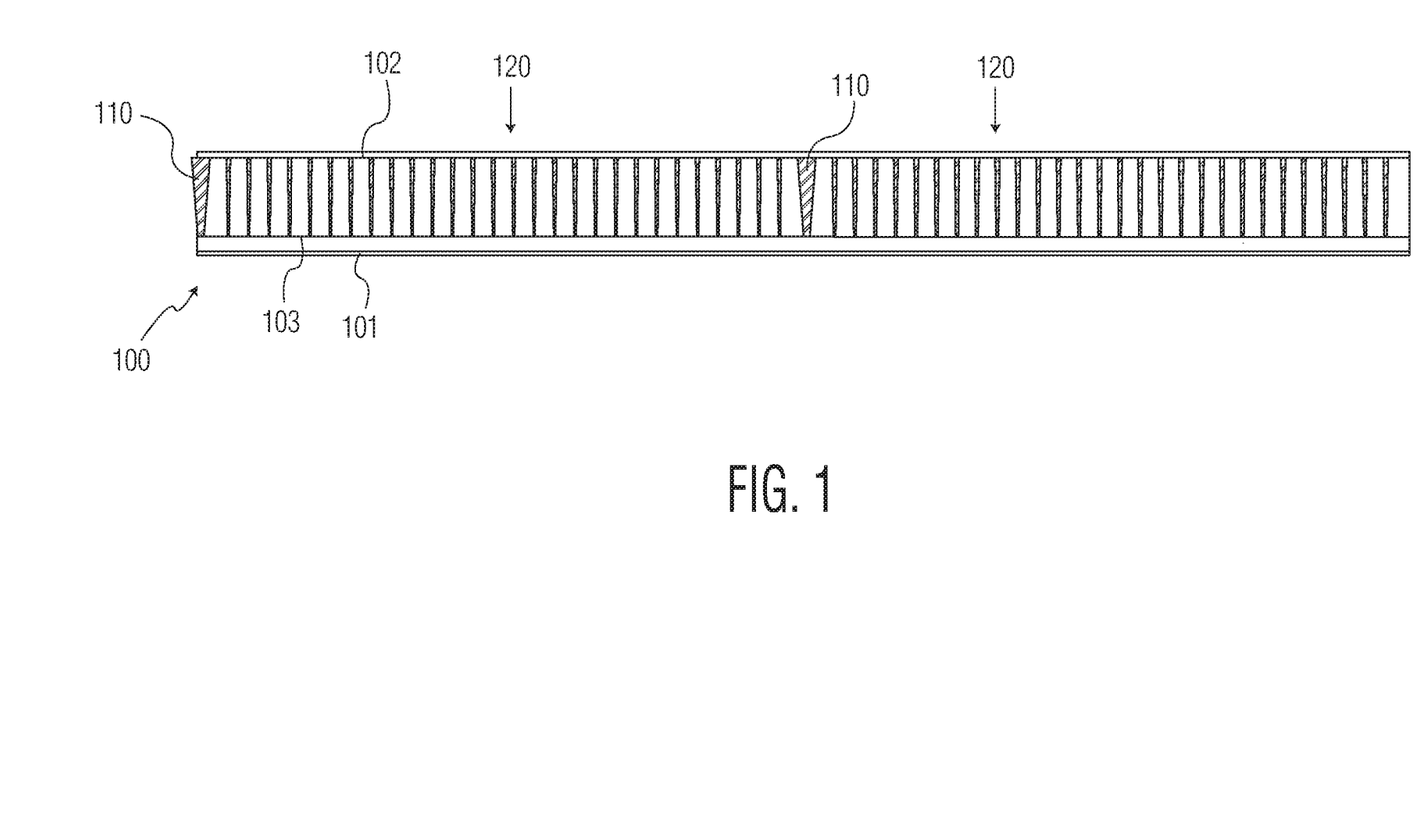
FIG. 1 is a side view of an exemplary window tile assembly, according to an aspect of the present disclosure.

Turning now to FIG. 1, a side view of an exemplary window tile assembly 100, according to an aspect of the present disclosure, is shown. The window tile assembly 100 comprises a first surface 102 and a second surface 103. The second surface 103 is adjacent to a foil 101 of an electron beam processing system (not shown). The window tile assembly 100 comprises one or more features 110, for example (without limitation), fins, ribs, holes, drilled holes, and other suitable support geometry configurations. The features 110 comprise a first diameter at the first surface 102 that is greater than a second diameter at the second surface 103, for example causing a tapering effect of features 110. During electron beam processing, electrons flow in the direction of arrow 120. The electrons pass between and/or through the features 110 of the window tile assembly 100, in the direction of arrow 120 through the foil 101. For example, where the features comprise solid structures (e.g., fins, ribs, etc.), the electrons pass between the features and where the features comprise holes, the electrons pass through the features. The non-uniform top or side view cross-section between the first surface 102 and the second surface 103 of features 110 allow the electrons to encounter less hindrance while moving through the window tile assembly 100 in the direction of arrow 120.

Figure 2:
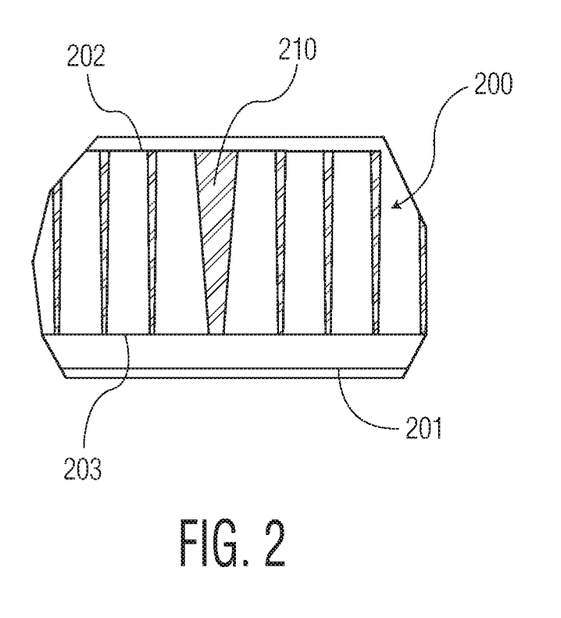
FIG. 2 is a close-up side view of a portion of an exemplary window tile assembly, according to an aspect of the present disclosure.

Turning now to FIG. 2, a close-up side view of a portion of an exemplary window tile assembly 200, according to an aspect of the present disclosure, is shown. The window tile assembly 200 comprises a first surface 202 and a second surface 203. The second surface 203 is adjacent to a foil 201 of an electron beam processing system (not shown). The window tile assembly 200 comprises feature 210 which can comprises a first diameter at the first surface 202 that is greater than a second diameter at the second surface 203, for example causing a tapering effect of feature 210.

Figure 3:
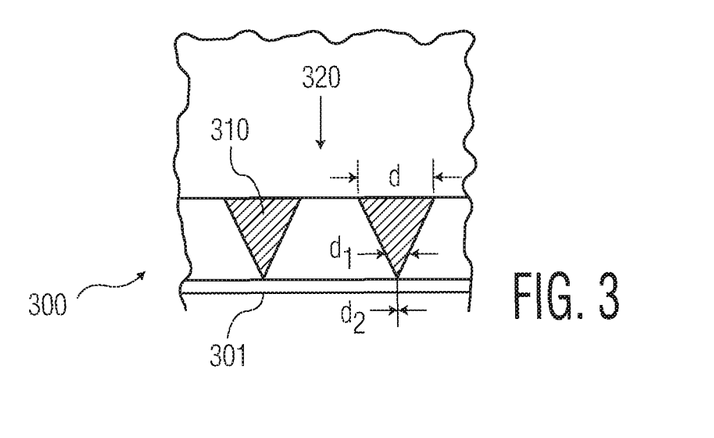
FIG. 3 is a close-up side view of a portion of an exemplary window tile assembly, according to an aspect of the present disclosure.

Turning now to FIG. 3, a close-up side view of a portion of an exemplary window tile assembly 300, according to an aspect of the present disclosure, is shown. The electron beam flow path 320 is in the direction from the vacuum chamber to the foil 301. The feature 310 has a side view cross-section that is generally triangular. The feature 310 has a first diameter d at first diameter d at the first surface (e.g., surface adjacent the vacuum chamber), a second diameter $d_2$ at the second surface (e.g., surface adjacent the foil), and a third diameter $d_1$ between the first surface and the second surface. For example in some embodiments, d is greater than $d_1$, and $d_1$ is greater than $d_2$.

Figure 4:
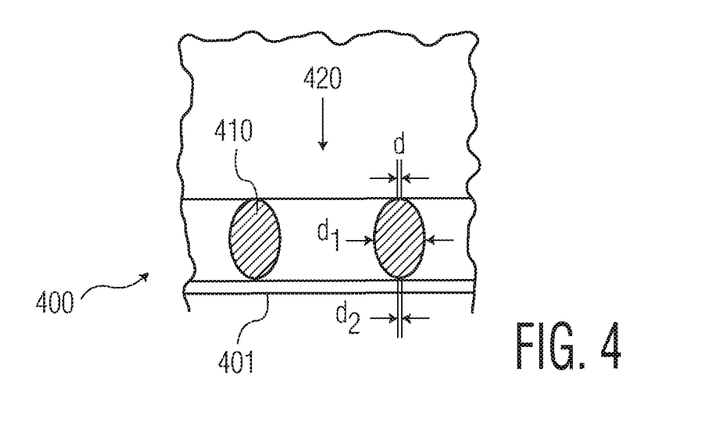
FIG. 4 is a close-up side view of a portion of an exemplary window tile assembly, according to an aspect of the present disclosure.

Turning now to FIG. 4, a close-up side view of a portion of an exemplary window tile assembly 400, according to an aspect of the present disclosure, is shown. The electron beam flow path 420 is in the direction from the vacuum chamber to the foil 401. The feature 410 has a side view cross-section that is generally elliptical. The feature 410 has a first diameter d at the first surface (e.g., surface adjacent the vacuum chamber), a second diameter $d_2$ at the second surface (e.g., surface adjacent the foil), and a third diameter $d_1$ between the first surface and the second surface. For example in some embodiments, d is less than $d_1$, and d is equal to $d_2$.

Figure 5:
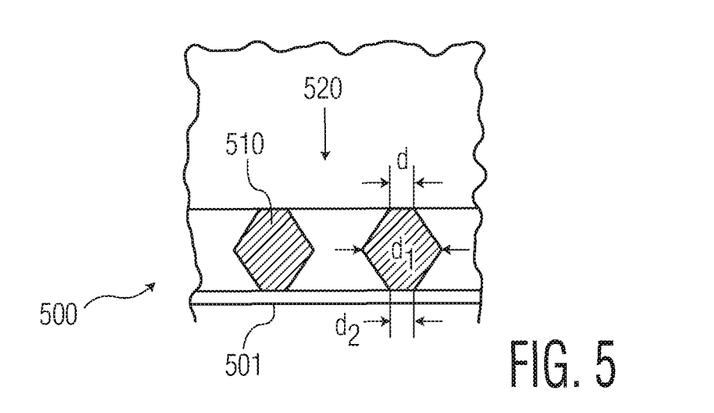
FIG. 5 is a close-up side view of a portion of an exemplary window tile assembly, according to an aspect of the present disclosure.

Turning now to FIG. 5, a close-up side view of a portion of an exemplary window tile assembly 500, according to an aspect of the present disclosure, is shown. The electron beam flow path 520 is in the direction from the vacuum chamber to the foil 501. The feature 510 has a side view cross-section that is generally hexagonal. The feature 510 has a first diameter d at the first surface (e.g., surface adjacent the vacuum chamber), a second diameter $d_2$ at the second surface (e.g., surface adjacent the foil), and a third diameter $d_1$ between the first surface and the second surface. For example in some embodiments, d is less than $d_1$, and d is equal to $d_2$.

Figure 6:
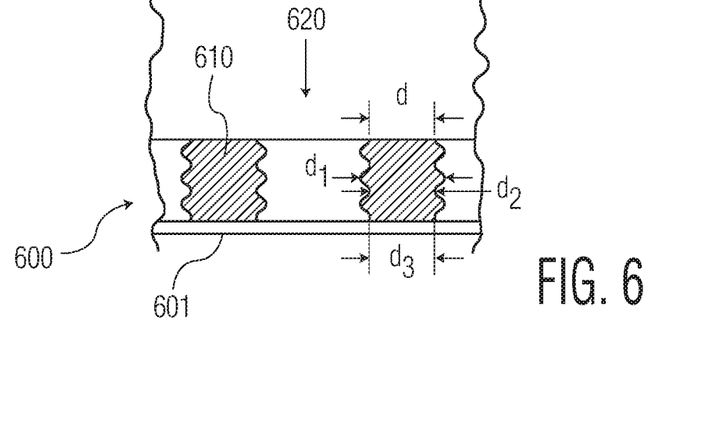
FIG. 6 is a close-up side view of a portion of an exemplary window tile assembly, according to an aspect of the present disclosure.

Turning now to FIG. 6, a close-up side view of a portion of an exemplary window tile assembly 600, according to an aspect of the present disclosure, is shown. The electron beam flow path 620 is in the direction from the vacuum chamber to the foil 601. The feature 610 has a side view cross-section that is irregularly shaped. The feature 610 has a first diameter d at the first surface (e.g., surface adjacent the vacuum chamber), a second diameter $d_3$ at the second surface (e.g., surface adjacent the foil), a third diameter $d_1$ between the first surface and the second surface, and a fourth diameter $d_2$ between the first surface and the second surface. For example in some embodiments, d is less than $d_1$, $d_1$ is greater than $d_2$, and d is equal to $d_3$.

Figure 7:
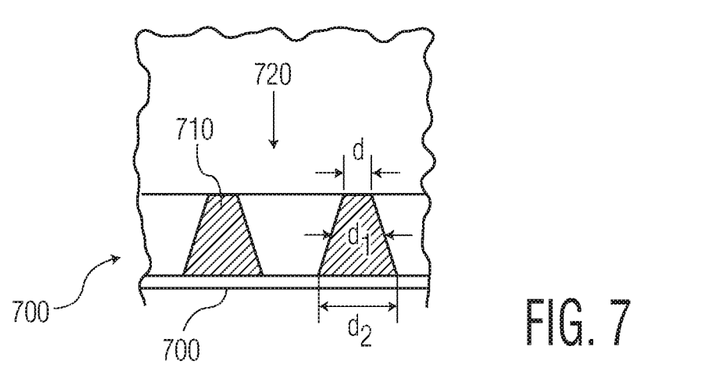
FIG. 7 is a close-up side view of a portion of an exemplary window tile assembly, according to an aspect of the present disclosure.

Turning now to FIG. 7, a close-up side view of a portion of an exemplary window tile assembly 700, according to an aspect of the present disclosure, is shown. The electron beam flow path 720 is in the direction from the vacuum chamber to the foil 701. The feature 710 has a side view cross-section that is generally trapezoidal. The feature 710 has a first diameter d at the first surface (e.g., surface adjacent the vacuum chamber), a second diameter $d_2$ at the second surface (e.g., surface adjacent the foil), and a third diameter $d_1$ between the first surface and the second surface. For example in some embodiments, d is less than $d_1$, and $d_1$ is less than $d_2$.

Figure 8:
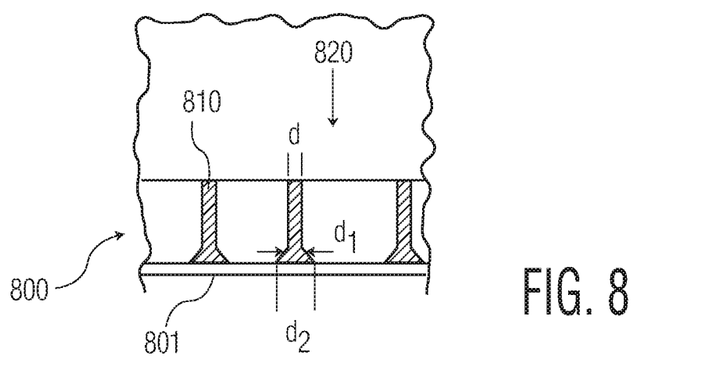
FIG. 8 is a close-up side view of a portion of an exemplary window tile assembly, according to an aspect of the present disclosure.

Turning now to FIG. 8, a close-up side view of a portion of an exemplary window tile assembly 800, according to an aspect of the present disclosure, is shown. The electron beam flow path 820 is in the direction from the vacuum chamber to the foil 801. The feature 810 has a side view cross-section that is generally conical flask shaped. The feature 810 has a first diameter d at the first surface (e.g., surface adjacent the vacuum chamber), a second diameter $d_2$ at the second surface (e.g., surface adjacent the foil), and a third diameter $d_1$ between the first surface and the second surface. For example in some embodiments, d is less than $d_1$, and $d_1$ is less than $d_2$.

While the present disclosure has been discussed in terms of certain embodiments, it should be appreciated that the present disclosure is not so limited. The embodiments are explained herein by way of example, and there are numerous modifications, variations and other embodiments that may be employed that would still be within the scope of the present disclosure.

The invention claimed is:

1. A foil support assembly for an electron beam system, comprising:
a window tile; and
a foil,
wherein the window tile comprises a first surface and a second surface; and one or more features extending from the first surface to the second surface;
wherein the one or more features have a non-uniform cross-section between the first surface and the second surface, and
wherein the second surface is adjacent to the foil.

2. The foil support assembly of claim 1, wherein the non-uniform cross-section is a top cross-section.

3. The foil support assembly of claim 1, wherein the first surface is configured to be exposed to vacuum conditions and configured to receive electrons accelerated from an electron beam generator.

4. The foil support assembly of claim 1, wherein the second surface is configured to allow electrons to pass through to the foil.

5. The foil support assembly of claim 1, wherein the first surface and the second surface are generally parallel.

6. The foil support assembly of claim 1, wherein the one or more features comprise one or more of a tapered surface.

7. The foil support assembly of claim 6, wherein the tapered surface comprises one or more of a fin, a rib, and a hole.

8. The foil support assembly of claim 1, wherein the features are evenly distributed throughout the window tile.

9. The foil support assembly of claim 1, wherein a diameter of the cross-section of one or more of the features is greater at the first surface than the second surface.

10. The foil support assembly of claim 1, wherein a diameter of the cross-section of one or more of the features is less at the first surface than the second surface.

11. The foil support assembly of claim 1, wherein a diameter of the cross-section of one or more of the features between the first surface and the second surface is greater than the top cross-section at the first surface and the second surface.

12. A foil support assembly for an electron beam system, comprising:
a window tile; and
a foil,
wherein the window tile comprises a top surface and a bottom surface, and one or more features extending from the top surface to the bottom surface,
wherein the one or more features comprise a side cross-section between the top surface and the bottom surface, and
wherein the side cross-section comprises at least one section that is not entirely perpendicular to the top surface and the bottom surface, and
wherein the second surface is adjacent to the foil.

13. The foil support assembly of claim 12, wherein the side cross-section of the one or more features is one or more of generally triangular shaped, generally trapezoidal shaped, generally elliptical shaped, generally hexagonal shaped, generally conical flask shaped, and irregularly shaped.

14. The foil support assembly of claim 12, wherein a width of the side cross-section at one or more distances between the top surface and the bottom surface is different from a width of the side cross-section at one or more other distances between the top surface and the bottom surface.

15. The foil support assembly of claim 12, wherein the one or more features comprise a first horizontal diameter of at the top surface, a second horizontal diameter at the bottom surface, and at least a third horizontal diameter at a distance between the top surface and the bottom surface.

16. The foil support assembly of claim 15, wherein the second horizontal diameter is greater than the third horizontal diameter and the third horizontal diameter is greater than the first horizontal diameter.

17. The foil support assembly of claim 15, wherein the first horizontal diameter is greater than the third horizontal diameter and the third horizontal diameter is greater than the second horizontal diameter.

18. The foil support assembly of claim 15, wherein the first horizontal diameter is equal to the second horizontal diameter and the third horizontal diameter is greater than both the first horizontal diameter and the second horizontal diameter.

19. The foil support assembly of claim 3, wherein the one or more features increases electron throughput through the tile and reduces heat absorption.

20. The foil support assembly of claim 4, where the one or more features reduces heat absorption by the window tile.

21. A foil support assembly for an electron beam system, comprising:
a window tile; and
a foil, wherein the window tile comprises a first surface and a second surface, and one or more features extending from the first surface to the second surface, wherein the one or more features comprise one or more cross-sectional areas at one or more distances between the first surface and the second surface and one or more other cross-sectional areas at one or more other distances between the first surface and the second surface;

wherein the one or more cross-sectional areas are different from the one or more other cross-sectional areas, and wherein the second surface is adjacent to the foil.

22. The foil support assembly of claim 21, wherein the one or more features comprise a first cross-sectional area at a first distance between the first surface and the second surface that is larger or smaller than a second cross-sectional area at a second distance between the first surface and the second surface.

23. An electron beam processing system comprising:
a vacuum chamber,
an atmospheric processing zone, and
a foil support assembly between the vacuum chamber and the atmospheric processing zone, the foil support assembly comprising:
a window tile; and
a foil,
wherein the window tile comprises a first surface adjacent to the vacuum chamber and a second surface adjacent to the foil, and one or more features extending from the first surface to the second surface;
wherein the one or more features have a non-uniform cross-section between the first surface and the second surface, and
wherein a diameter of the cross-section of one or more of the features is greater at the first surface than the second surface.

24. A window tile for an electron beam system, comprising:
a first surface and a second surface; and
one or more features extending from the first surface to the second surface;
wherein the one or more features have a non-uniform cross-section between the first surface and the second surface, and
wherein a diameter of the cross-section of one or more of the features between the first surface and the second surface is greater than the top cross-section at the first surface and the second surface.

25. The window tile of claim 24, wherein the non-uniform cross-section is a top cross-section.

26. The window tile of claim 24, wherein the first surface is configured to be exposed to vacuum conditions and configured to receive electrons accelerated from an electron beam generator.

27. The window tile of claim 24, wherein the second surface is configured to allow electrons to pass through to a foil.

28. The window tile of claim 24, wherein the first surface and the second surface are generally parallel.

29. The window tile of claim 24, wherein the one or more features comprise one or more of a tapered surface.

30. The window tile of claim 29, wherein the tapered surface comprises one or more of a fin, a rib, and a hole.

31. The window tile of claim 24, wherein the features are evenly distributed throughout the window tile.

32. The window tile of claim 24, wherein a diameter of the cross-section of one or more of the features is greater at the first surface than the second surface.

33. The window tile of claim 24, wherein a diameter of the cross-section of one or more of the features is less at the first surface than the second surface.

34. The window tile of claim 24, wherein a diameter of the cross-section of one or more of the features at the first surface is substantially the same as a diameter of the cross-section of the one or more features at the second surface.

35. The window tile of claim 26, wherein the one or more features increases electron throughput through the tile and reduces heat absorption.

36. The window tile of claim 27, where the one or more features reduces heat absorption by the window tile.

37. A window tile for an electron beam system, comprising:
a top surface and a bottom surface, and
one or more features extending from the top surface to the bottom surface,
wherein the one or more features comprise a side cross-section between the top surface and the bottom surface,
wherein the side cross-section comprises at least one section that is not entirely perpendicular to the top surface and the bottom surface,
wherein the one or more features comprise a first horizontal diameter of at the top surface, a second horizontal diameter at the bottom surface, and at least a third horizontal diameter at a distance between the top surface and the bottom surface, and
wherein the first horizontal diameter is equal to the second horizontal diameter and the third horizontal diameter is greater than both the first horizontal diameter and the second horizontal diameter.

38. A window tile for an electron beam system, comprising:
a first surface and a second surface;
one or more features extending from the first surface to the second surface,
wherein the one or more features comprise one or more cross-sectional areas at one or more distances between the first surface and the second surface and one or more other cross-sectional areas at one or more other distances between the first surface and the second surface;
wherein the one or more cross-sectional areas are different from the one or more other cross-sectional areas, and
wherein the one or more features comprise a first cross-sectional area at a first distance between the first surface and the second surface that is larger or smaller than a second cross-sectional area at a second distance between the first surface and the second surface.

39. A foil support assembly for an electron beam system, comprising:
a window tile; and
a foil,
wherein the window tile comprises a first surface and a second surface; and one or more features extending from the first surface to the second surface;
wherein the one or more features have a non-uniform cross-section between the first surface and the second surface, and
wherein the foil comprises a first material, the window tile comprises a second material, and the first material is dissimilar to the second material.

40. The foil support assembly of claim 39, wherein the second material is copper.

41. The foil support assembly of claim 40, wherein the first material is titanium.

42. A window tile for an electron beam system, comprising:
- a first surface and a second surface; and
- one or more features extending from the first surface to the second surface;
- wherein the one or more features have a non-uniform cross-section between the first surface and the second surface, and
- wherein the window tile is made of copper.

* * * * *